(12) United States Patent
Imura et al.

(10) Patent No.: US 11,594,662 B2
(45) Date of Patent: Feb. 28, 2023

(54) LIGHT-EMITTING DEVICE

(71) Applicant: NICHIA CORPORATION, Anan (JP)

(72) Inventors: Toshifumi Imura, Anan (JP);
Masafumi Kuramoto, Tokushima (JP);
Hiroki Inoue, Anan (JP)

(73) Assignee: NICHIA CORPORATION, Anan (JP)

( * ) Notice: Subject to any disclaimer, the term of this patent is extended or adjusted under 35 U.S.C. 154(b) by 122 days.

(21) Appl. No.: 16/942,767

(22) Filed: Jul. 30, 2020

(65) Prior Publication Data
US 2021/0036193 A1 Feb. 4, 2021

(30) Foreign Application Priority Data

Jul. 31, 2019 (JP) .............................. JP2019-141061
Nov. 13, 2019 (JP) .............................. JP2019-205834

(51) Int. Cl.
*H01L 33/54* (2010.01)
*H01L 23/00* (2006.01)
(Continued)

(52) U.S. Cl.
CPC .............. *H01L 33/54* (2013.01); *H01L 24/29* (2013.01); *H01L 24/32* (2013.01); *H01L 33/50* (2013.01); *H01L 33/56* (2013.01); *H01L 33/60* (2013.01); *H01L 33/62* (2013.01); *H01L 2224/29291* (2013.01); *H01L 2224/29386* (2013.01);
(Continued)

(58) Field of Classification Search
CPC ......... H01L 33/46; H01L 24/32; H01L 33/62; H01L 33/50; H01L 33/507; H01L 33/644; H01L 33/54; H01L 33/60; H01L 33/32; H01L 24/29; H01L 33/52; H01L 33/508;
(Continued)

(56) References Cited

U.S. PATENT DOCUMENTS

2011/0180822 A1* 7/2011 Ruhnau ............... H01L 31/0203
257/E31.127
2011/0186340 A1* 8/2011 Kuramoto ............... H01L 24/83
252/514

(Continued)

FOREIGN PATENT DOCUMENTS

JP  2015-109354  6/2015
JP  2015-213157  11/2015
(Continued)

*Primary Examiner* — Mouloucoulaye Inoussa
(74) *Attorney, Agent, or Firm* — Mori & Ward, LLP

(57) ABSTRACT

A light-emitting device includes: a light-emitting element including a first surface provided as a light extraction surface, a second surface opposite to the first surface, a plurality of third surfaces between the first surface and the second surface, and a positive electrode and a negative electrode at the second surface; a light-transmissive member disposed at the first surface; and a bonding member disposed between the light-emitting element and the light-transmissive member and covering from the first surface to the plurality of third surfaces of the light-emitting element to bond the light-emitting element and the light-transmissive member. The bonding member is made of a resin that contains nanoparticles. The nanoparticles have a particle diameter of 1 nm or more and 30 nm or less and a content of 10 mass % or more and 20 mass % or less.

20 Claims, 9 Drawing Sheets

(51) Int. Cl.
  *H01L 33/50* (2010.01)
  *H01L 33/60* (2010.01)
  *H01L 33/62* (2010.01)
  *H01L 33/56* (2010.01)
(52) U.S. Cl.
  CPC ............... *H01L 2224/29499* (2013.01); *H01L 2224/32225* (2013.01); *H01L 2933/005* (2013.01); *H01L 2933/0091* (2013.01)
(58) Field of Classification Search
  CPC ....... H01L 33/56; H01L 23/295; H01L 24/48; H01L 24/73; H01L 33/58; G02B 6/0003
  USPC ....... 257/98, 99, 88, 432, E27.121, E33.061, 257/E33.072, E31.127, E33.012; 438/26, 438/27, 29
  See application file for complete search history.

(56) References Cited

U.S. PATENT DOCUMENTS

| | | | | |
|---|---|---|---|---|
| 2012/0236582 A1* | 9/2012 | Waragaya | ............. | H01L 33/507 257/E33.072 |
| 2013/0277707 A1* | 10/2013 | Miyata | .................... | H01L 33/62 438/26 |
| 2014/0131753 A1* | 5/2014 | Ishida | ..................... | H01L 33/54 257/98 |
| 2015/0001564 A1* | 1/2015 | Oguro | .................... | H01L 33/60 257/98 |
| 2015/0162509 A1 | 6/2015 | Kuramoto et al. | | |
| 2015/0295153 A1* | 10/2015 | Kuramoto | ............... | H01L 24/29 257/98 |
| 2016/0293810 A1 | 10/2016 | Baike et al. | | |
| 2018/0123005 A1 | 5/2018 | Ozeki et al. | | |
| 2018/0212128 A1* | 7/2018 | Hayashi | ................ | H01L 33/507 |
| 2018/0269361 A1* | 9/2018 | Hayashi | ................ | H01L 33/505 |
| 2018/0315897 A1 | 11/2018 | Nakabayashi et al. | | |

FOREIGN PATENT DOCUMENTS

| | | |
|---|---|---|
| JP | 2016-197715 | 11/2016 |
| JP | 2018-026592 | 2/2018 |
| JP | 2019-016763 | 1/2019 |
| JP | 2019-016766 | 1/2019 |
| JP | 2019-050395 | 3/2019 |

\* cited by examiner

LIGHT-EMITTING DEVICE

CROSS-REFERENCE TO RELATED APPLICATIONS

The present application claims priority under 35 U.S.C. § 119 to Japanese Patent Application No. 2019-141061, filed Jul. 31, 2019, and Japanese Patent Application No. 2019-205834, filed Nov. 13, 2019. The contents of these applications are incorporated herein by reference in their entirety.

BACKGROUND

1. Field of the Invention

The present disclosure relates to a light-emitting device.

2. Description of Related Art

Light-emitting devices including a light-emitting element such as a light-emitting diode or a laser diode are used in various fields including general lighting such as interior lighting, light sources for vehicles, and backlights for liquid-crystal display devices.

Known examples of such a light-emitting device include a light emitting device including at least one light-emitting element, at least one light-transmissive member at a light extraction surface side of the light-emitting element, and at least one bonding member bonding the at least one light-emitting element and the at least one light-transmissive member (see, for example, Japanese Unexamined Patent Application Publication No. 2019-016766).

SUMMARY

One object of certain embodiments of the present disclosure is to provide a light-emitting device in which a bonding member has a stable fillet shape and a light extraction efficiency is improved.

A light-emitting device according to one embodiment of the present disclosure includes: a light-emitting element including a first surface provided as a light extraction surface, a second surface opposite to the first surface, a plurality of third surfaces between the first surface and the second surface, and a positive electrode and a negative electrode at the second surface; a light-transmissive member disposed at the first surface; and a bonding member disposed between the light-emitting element and the light-transmissive member and covering from the first surface to the plurality of third surfaces of the light-emitting element to bond the light-emitting element and the light-transmissive member. The bonding member is made of a resin that contains nanoparticles. The nanoparticles have a particle diameter of 1 nm or more and 30 nm or less and a content of 10 mass % or more and 20 mass % or less.

Also, a light-emitting device according to another embodiment of the present disclosure includes: a light-emitting element including a first surface provided as a light extraction surface, a second surface opposite to the first surface, a plurality of third surfaces between the first surface and the second surface, and a positive electrode and a negative electrode at the second surface; a light-transmissive member disposed at the first surface; and a bonding member disposed between the light-emitting element and the light-transmissive member and covering from the first surface to the plurality of third surfaces of the light-emitting element to bond the light-emitting element and the light-transmissive member. The bonding member is made of a resin that contains nanoparticles. The nanoparticles have a particle diameter of more than 30 nm and less than 100 nm and a content of 0.5 mass % or more and 10 mass % or less.

According to certain embodiments of the present disclosure, a light-emitting device including a bonding member having a fillet of a stable shape and having a high light extraction efficiency can be obtained.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Figure 1:
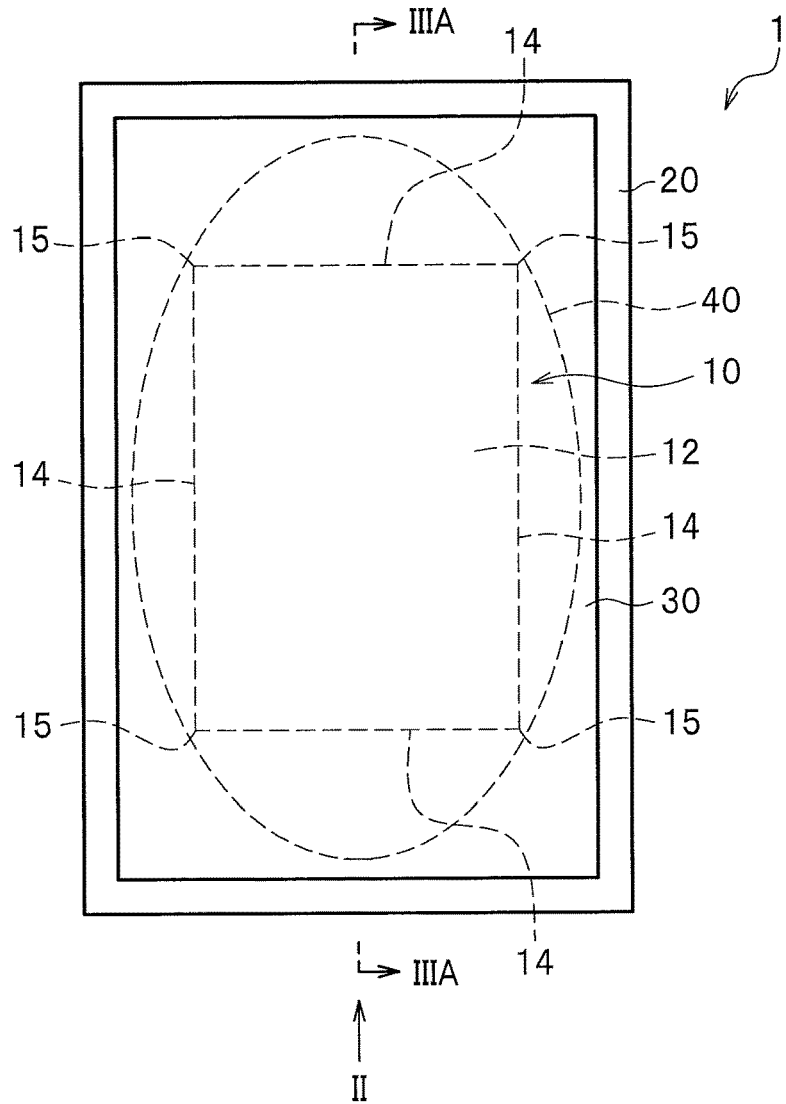
FIG. 1 is a schematic plan view illustrating the structure of a light-emitting device according to a first embodiment.

A light-emitting device and a method of manufacturing the light-emitting device according to certain embodiments will be described below with reference to the drawings. The embodiments described below show examples of a light-emitting device to give a concrete form to the technical idea of the present invention, and the present invention is not limited to the embodiments described below. Unless specifically stated otherwise, the sizes, materials, shapes, and relative positions of constituent components described in the embodiments below are not intended to limit the scope of the present invention only to the descriptions below, but are intended as examples for illustration. Sizes, positional relations, and the like of members illustrated in the drawings may be exaggerated in order to clarify the descriptions. In the descriptions below, the same term or reference numeral represents the same member or a member made of the same material, and its detailed description may be omitted when appropriate.

First Embodiment

Light-Emitting Device

A light-emitting device according to a first embodiment will be described below.

Figure 2:
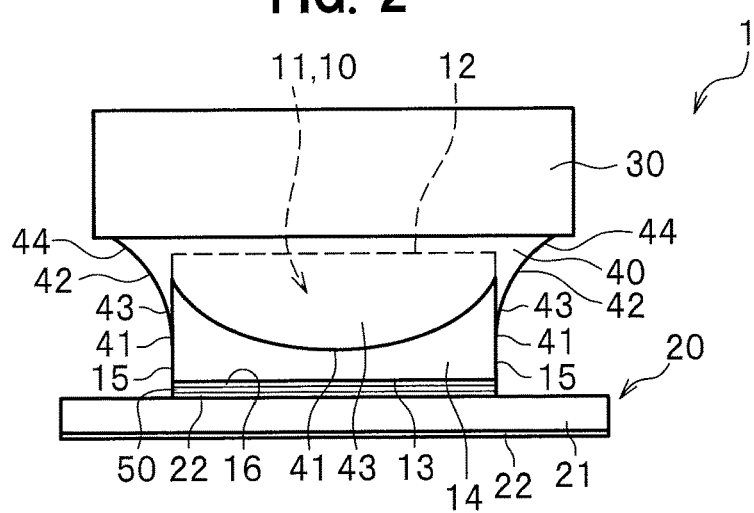
FIG. 2 is a schematic side view of the light-emitting device shown in FIG. 1 in the short direction viewed along the direction indicated by II.
Figure 3A:
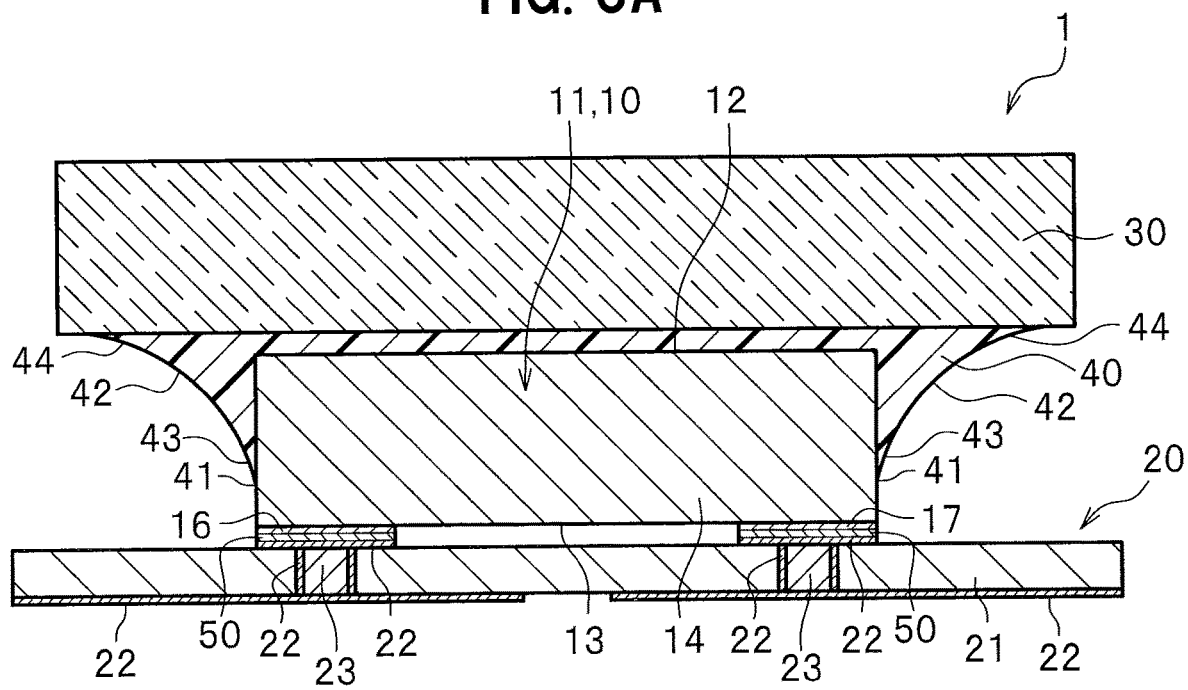
FIG. 3A is a schematic cross-sectional view in the longitudinal direction taken along line IIIA-IIIA of the light-emitting device of FIG. 1.
Figure 3B:
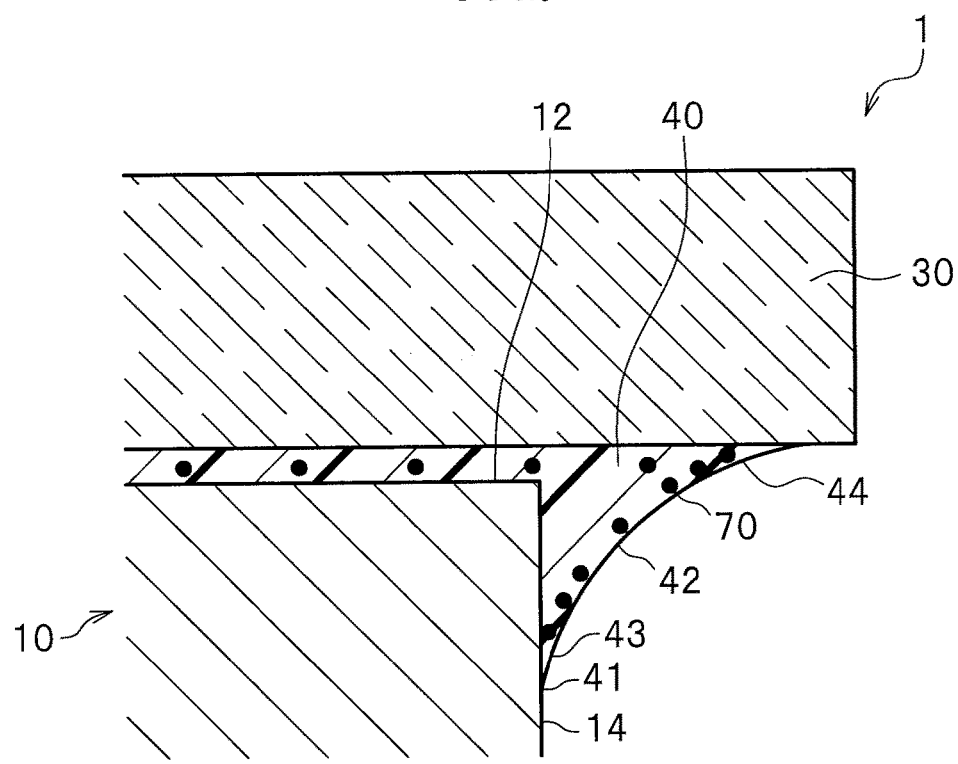
FIG. 3B is a schematic partial enlarged cross-sectional view of FIG. 3A illustrating a distribution of nanoparticles in a bonding member.
Figure 4:
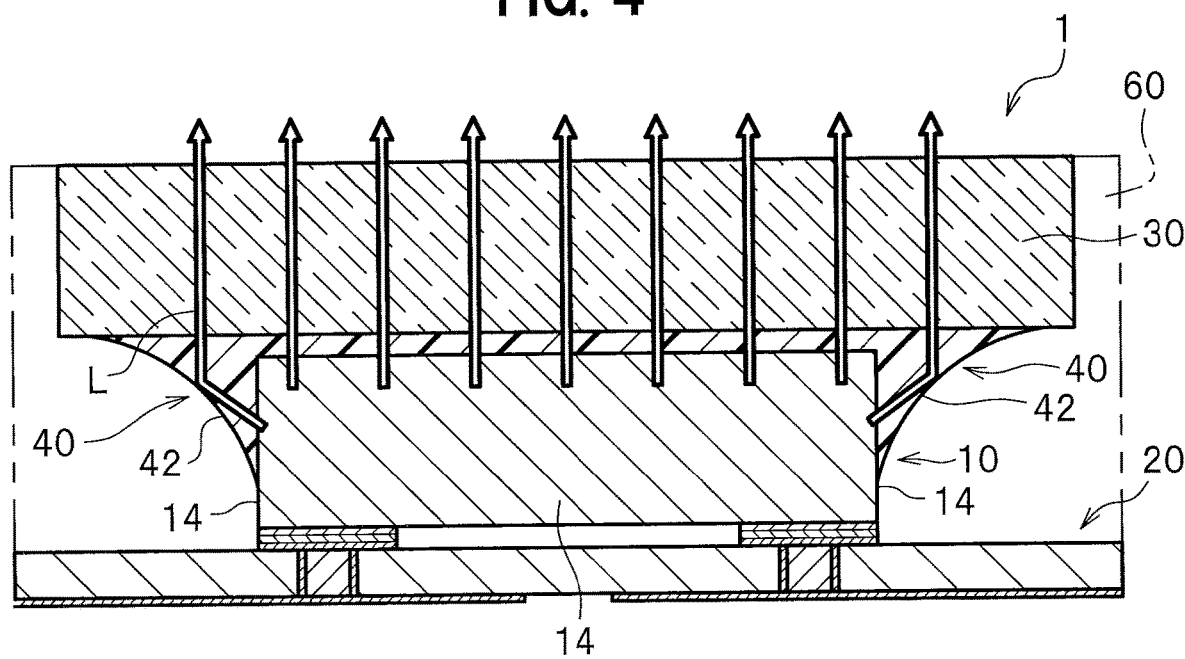
FIG. 4 is a schematic cross-sectional view illustrating light emission from the light-emitting device in which the bonding member forms a fillet in the light-emitting device according to the first embodiment.

FIG. 1 is a schematic plan view illustrating the structure of a light-emitting device according to the first embodiment. FIG. 2 is a schematic side view in the short direction of the light-emitting device of FIG. 1 when viewed from a direction indicated by II. FIG. 3A is a schematic cross-sectional view in the longitudinal direction taken along a line IIIA-IIIA of the light-emitting device of FIG. 1. FIG. 3B is a schematic partial enlarged cross-sectional view of FIG. 3A illustrating a distribution of nanoparticles in a bonding member. FIG. 4 is a schematic cross-sectional view illustrating light emission from the light-emitting device in which the bonding member forms a fillet in the light-emitting device according to the first embodiment.

As shown in FIGS. 1 to 3B, a light-emitting device 1 includes a light-emitting element 10 that has a first surface 12 serving as a light extraction surface, a second surface 13 opposite to the first surface 12, a plurality of third surfaces 14 between the first surface 12 and the second surface 13, and a pair of electrodes 16 and 17 at a second surface 13 side; a light-transmissive member 30 disposed at a first surface 12 side; and a bonding member 40 disposed between the light-emitting element 10 and the light-transmissive member 30 and covering from the first surface 12 to the plurality of third surfaces 14 of the light-emitting element 10 to bond the light-emitting element 10 and the light-transmissive member 30. The bonding member 40 is made of a resin that contains nanoparticles 70. The nanoparticles 70 have a particle diameter of 1 nm or more and 30 nm or less and a content of 10 mass % or more and 20 mass % or less.

The light-emitting device 1 can be a top-view light-emitting device in which the first surface 12 serving as a light extraction surface of the light-emitting element 10 is located at an upper surface side, or can be a side-view light-emitting device in which the first surface 12 serving as a light extraction surface of the light-emitting element 10 is located at a lateral surface side. In the description below, the components of the top-view light-emitting device will be described as an example.

Light-Emitting Element

The light-emitting element 10 has a first surface 12 serving as a light extraction surface, a second surface 13 opposite to the first surface 12, and a plurality of third surfaces 14 between the first surface 12 and the second surface 13. In a plan view, the light-emitting element 10 preferably has a rectangular shape having corner portions 15 defined by adjacent ones of the plurality of third surfaces 14, particularly preferably has a square or a rectangular shape having a longer side in a single direction. The light-emitting element 10 can have other shapes in a plan view, for example, a polygonal shape with five or more angles, such as a hexagonal shape. When the light-emitting element 10 has a rectangular shape with a longer side in a plan view, the light-emitting device 1 can have a smaller thickness than when the light-emitting element has a square shape having the same light-emitting area. When the light-emitting element has a polygonal shape with five or more angles, the area to be occupied by the light-emitting element can be increased to improve the light-emission efficiency, compared with a layout in which the light-emitting element having a square shape and is disposed to be rotated at an angle of 45 degrees around an axis perpendicular to the first surface 12. Thus, an output of the light-emitting device 1 can be increased while having the same size as conventional light-emitting devices. Instead of or in addition to high output, the light-emitting device 1 can have a smaller size than a conventional light-emitting device. Each of the third surfaces 14 of the light-emitting element 10 can be perpendicular to or inclined inwardly or outwardly with respect to the first surface 12. The light-emitting element 10 is a semiconductor element that emits light when voltage is applied, and includes at least a semiconductor layered body 11. The semiconductor layered body 11 includes a pair of electrodes 16 and 17 disposed at a same surface side of the semiconductor layered body 11. In the light-emitting element 10, the surface at which the pair of electrodes 16 and 17 are disposed serves as the second surface 13. The first surface 12 opposite to the second surface 13 serves as the light extraction surface. The light-emitting element 10 can further include an element substrate at the first surface 12 side of the semiconductor layered body 11.

A known light-emitting element can be used for the semiconductor layered body 11. For example, a light-emitting diode or a laser diode is preferably used. A light-emitting element configured to emit light with any appropriate emission wavelength can be selected as the semiconductor layered body 11. Examples of a blue or green light-emitting element 10 to be used include a light-emitting element containing a nitride semiconductor ($In_XAl_YGa_{1-X-Y}N$, $0 \leq X$, $0 \leq Y$, $X+Y \leq 1$) or GaP. For a red light-emitting element 10, GaAlAs, AlInGaP, or the like can be used as well as a nitride semiconductor. A semiconductor layered body 11 made of materials other than the materials described above can also be used for the light-emitting element 10. The composition, emission color, size, and number of the light-emitting element 10 can be appropriately selected according to the purpose. When using a nitride semiconductor for the light-emitting element 10, a nitride semiconductor having a peak emission wavelength of 400 nm or more and 550 nm or less, preferably of 440 nm or more and 465 nm or less is preferably used. Using such a nitride semiconductor allows for improving the color rendering properties of the light-emitting device 1.

The light-emitting element 10 includes at least one p-side electrode and at least one n-side electrode. Further, the number of the p-side electrode(s) and the number of the n-side electrode(s) may not be the same. The electrodes 16 and 17 can be made of, for example, gold, silver, tin, platinum, rhodium, titanium, aluminum, tungsten, palladium, nickel, or an alloy of two or more of these metals. Examples of an element substrate include sapphire, gallium nitride, aluminum nitride, silicon, silicon carbide, gallium arsenide, gallium phosphide, indium phosphide, zinc sulfide, zinc oxide, zinc selenide, and diamond.

Supporting Member

At least one light-emitting element 10 is mounted on a supporting member 20 that electrically connects the light-emitting element 10 to an external device. The supporting member 20 includes a base member 21 having a flat plate shape, and wirings 22 disposed on a surface of and/or inside (i.e., a through hole of) the base member 21. In addition to the wirings 22, filling members 23 of an electroconductive or insulating material can be disposed inside (i.e., the through hole of) the base member 21 to fill the through hole of the base member 21. The supporting member 20 is electrically connected to the light-emitting element 10 by connecting each of the wirings 22 and a respective one of the electrodes 16 and 17 of the light-emitting element 10 via a respective one of electroconductive bonding members 50. The structure such as shape and size of the wirings 22 of the supporting member 20 is selected in accordance with the constitution and size of the electrodes 16 and 17 of the light-emitting element 10.

Removing the supporting member 20 of the light-emitting device 1 allows for downsizing the light-emitting device 1, which will be described below.

For the base member 21 of the supporting member 20, a material being electrically insulative, being less likely to transmit light emitted from the light-emitting element 10 or external light, and/or having a certain strength is preferably used. More specifically, the base member 21 can be made of a ceramic such as alumina, aluminum nitride, or mullite, or a resin such as phenolic resins, epoxy resins, polyimide resins, bismaleimide-triazine resins (BT resins), or polyphthalamide.

The wirings 22 can be made of, for example, copper, iron, nickel, tungsten, chromium, aluminum, silver, gold, titanium, palladium, rhodium, or an alloy of two or more of these metals. Also, a layer made of silver, platinum, aluminum, rhodium, gold, or an alloy of these metals can be disposed on a surface layer of each of the wirings 22, in view of the wettability and/or light reflectivity of the electroconductive bonding members 50.

For the electroconductive bonding members 50, bumps made of gold, silver, or copper; a metal paste containing a resin binder and powder of a metal such as silver, gold, copper, platinum, aluminum, and palladium; a tin-bismuth, tin-copper, tin-silver, and gold-tin solders; or a brazing filler metal such as a low-melting-point metal can be used.

Light-Transmissive Member

The light-transmissive member 30 is disposed at the first surface 12 side of the light-emitting element 10 via the bonding member 40. The light-transmissive member 30 are bonded to the light-emitting element 10, and preferably is larger than the first surface 12 of the light-emitting element 10 in a plan view, so as to cover the entirety of the first surface 12 of the light-emitting element 10. In other words, the periphery of the lower surface of the light-transmissive member 30 is preferably located outward of the periphery of the first surface 12 of the light-emitting element 10 in a plan view. With the light-transmissive member 30 having the lower surface with an area larger than an area of the first surface 12 of the light-emitting element 10, light emitted from the light-emitting element 10 can be incident on the light-transmissive member 30 efficiently.

The light-transmissive member 30 is preferably made of a resin material that contains a wavelength conversion substance adapted to convert wavelength of at least a portion of light emitted from the light-emitting element 10. Examples of the resin material include silicone resins, epoxy resins, phenolic resins, polycarbonate resins, acrylic resins, TPX resins, polynorbornene resins, modified resins, and hybrid resins of these resins. Among these resin materials, a silicone resin that has good heat resistance, electrical insulation, and flexibility is preferably contained.

A phosphor can be used for the wavelength conversion substance. Examples of the phosphor that can be excited by a blue light-emitting element or an ultraviolet light-emitting element include: cerium-activated yttrium-aluminum-garnet-based phosphors (YAG:Ce); cerium-activated lutetium-aluminum-garnet-based phosphors (LAG:Ce); europium- and/or chromium-activated nitrogen-containing calcium aluminosilicate-based phosphors (CaO-$\mu$l2O3-SiO2:Eu); europium-activated silicate-based phosphors ((Sr,Ba)2SiO4: Eu, Cr); nitride-based phosphors such as $\beta$-SiAlON phosphors, CASN-based phosphors (CaAlSiN3:Eu), and SCASN-based phosphors ((Sr,Ca)AlSiN3:Eu); KSF-based phosphors (K2SiF6:Mn); sulfide-based phosphors; and quantum-dot phosphors. Using a combination of such phosphor with a blue light-emitting element or an ultraviolet light-emitting element, the light-emitting device 1 with various emission colors (for example, the light-emitting device 1 that emits white light) can be obtained. The concentration of the phosphor contained in the light-transmissive member 30 is, for example, approximately 50 mass % or more and 200 mass % or less.

The light-transmissive member 30 can further contain a light-diffusing material. Examples of the light-diffusing material include titanium oxide, barium titanate, aluminum oxide, and silicon oxide. In the light-transmissive member 30, the phosphor can be dispersed throughout the light-transmissive member 30. Alternatively, the phosphor can be disposed predominantly at the light-emitting element 10 side or its opposite side of the light-transmissive member 30.

Bonding Member

The bonding member 40 is disposed between the light-emitting element 10 and the light-transmissive member 30 and covers from the first surface 12 to the plurality of third surfaces 14 of the light-emitting element 10 to bond the light-emitting element 10 and the light-transmissive member 30. The bonding member 40 is disposed across the third surfaces 14 and the first surface 12. The bonding member 40 preferably covers the entirety of the first surface 12. This allows the light-emitting element 10 to be strongly bonded to the light-transmissive member 30. As shown in the drawings, the bonding member 40 covers at least a portion of each of the third surfaces 14. Further, the bonding member 40 is made of a resin that contains nanoparticles 70.

As shown in FIG. 2, the bonding member 40 containing the nanoparticles is disposed such that a lower edge 41 of the bonding member 40 covering each of the third surfaces 14 is located above the second surface 13 in a side view. The lower edge 41 of the bonding member 40 is preferably curved convexly from the corner portion 15 toward the center of the third surface 14. When having the corner portion 15 defined by adjacent ones of the plurality of third surfaces 14, a portion of the bonding member 40 at the corner portion 15 is located closer to the light-transmissive member 30 than to the center of the height of the light-emitting element 10. A portion of the bonding member 40 at the central portion of the third surface 14 in a width direction of the third surface 14 is located closer to the supporting member 20 than to the center of the light-emitting element 10 in a height direction of the light-emitting element 10. The expression "curve in a convex shape" includes not only a shape formed by a single arc but also a shape formed by small wave-like shapes that make an arc-like shape as a whole. As shown in FIG. 3A, in the bonding member 40 that contains the nanoparticles 70, an outer surface 42 of the bonding member 40 that covers the third surface 14 is preferably is curved concavely from the light-transmissive member 30 toward the third surface 14 in a cross-sectional view.

As described above, the bonding member 40, which contains the nanoparticles 70, has a shape including the convex-curved lower edge 41 and a concave curve from the light-transmissive member 30 toward the third surface 14. This structure allows for reducing dripping of the resin of the bonding member 40. Accordingly, a fillet of the bonding member 40 can be stably formed between the light-emitting element 10 and the light-transmissive member 30, such that the fillet has the outer surface 42 inclined to gradually increase a width of the bonding member 40 toward the light-transmissive member 30. In such a fillet, the area in which the bonding member 40 and the light-transmissive member 30 are in contact with each other, that is, the area in which the bonding member 40 and a back surface of the light-transmissive member 30 (a surface facing the light-emitting element 10) are in contact with each other is larger than the area of the first surface 12 of the light-emitting element 10. As shown in FIG. 1, on the back surface of the light-transmissive member 30, the bonding member 40 has a greater width at the center of the third surface 14 and a smaller width at the corner portion 15 in a plan view. In the present embodiment, the light-emitting element 10 has a rectangular shape in a plan view, and the bonding member 40 has an oval shape.

In the light-emitting device 1, as shown in FIG. 4, the light-emitting element 10 and the bonding member 40 can be covered with a covering member 60 that contains a reflective material.

In the light-emitting device 1 according to the present embodiment in which the bonding member 40 forms the fillet, the bonding member 40 covering the third surfaces 14 functions as a light-guiding member for light L that is emitted laterally from the light-emitting element 10. With this structure, the light L, emitted laterally, can be reflected on the outer surface 42 of the bonding member 40 toward the light-transmissive member 30. Accordingly, luminous flux of the light L emitted toward the light-transmissive member 30 can be increased, so that light-extraction performance of the light-emitting device 1 can be increased.

The ratio of the bonding member 40 covering the third surfaces 14 is preferably 10% to 95% of the whole area of the third surfaces 14. This structure of the bonding member 40 allows for increasing bonding strength between the light-emitting element 10 and the light-transmissive member 30, and the light extraction efficiency of light emitted from the light-emitting element 10. Further, the bonding member 40 preferably covers an upper portion of the corner portion 15 such that the first surface 12 is not exposed. With the bonding member 40 having this structure, the bonding member 40 can be prevented from being detached at the corner portion 15, in which tensile stress generated at the interface between the light-emitting element 10 and the bonding member 40 is concentrated, and bonding strength between the light-emitting element 10 and the light-transmissive member 30 can be increased.

The nanoparticles 70 of the bonding member 40 has a particle diameter of 1 nm or more and 30 nm or less and a content of 10 mass % or more and 20 mass % or less.

When the particle diameter of the nanoparticles 70 is 1 nm or more and the content of nanoparticles 70 is 10 mass % or more, in a bonding step S3 (see FIGS. 5 and 6D) in manufacturing the light-emitting device 1, which will be described below, the viscosity and fluidity of the bonding member 40 is good enough to reduce dripping of the resin of the bonding member 40.

When the particle diameter of the nanoparticles 70 is 30 nm or less and the content of nanoparticles 70 is 20 mass % or less, turbidity of the bonding member 40 due to excessive content of the nanoparticles 70 and light scattering due to the aggregated nanoparticles 70 (aggregates) can be reduced. This allows for increasing the luminous flux of the light-emitting device 1 to improve the light-extraction performance.

It is known that, when an optical film has a thickness of equal to or less than a quarter of a wavelength of the incident light, the light beams reflected on the boundary surface of materials are mutually canceled and the reflectivity becomes minimum. Accordingly, appropriately selecting the particle diameter of the nanoparticles 70 or adjusting the content of the nanoparticles 70 such that the size (the maximum size) of the aggregates of the nanoparticles 70 is equal to or less than a quarter of the wavelength of light emitted from the light-emitting element 10 allows for reducing unnecessary light scattering caused by the agglomerates of the nanoparticles 70. This allows for increasing the luminous flux to improve the light-extraction performance.

The nanoparticles 70 and the aggregates of nanoparticles 70 can have a function to scatter light emitted from the light-emitting element 10. In particular, the nanoparticles 70 can increase scattering of light having short wavelength such as a blue light by Rayleigh scattering. Rayleigh scattering allows the light L emitted from the light-emitting element to be widely spread to the bonding surface between the bonding member 40 and the light-transmissive member 30. This can facilitate the efficient excitation of the wavelength conversion substance in the light-transmissive member 30, so that the light extraction efficiency can be increased. Also, a content of the wavelength conversion substance can be reduced to allow reduction of the cost of the light-emitting device.

For the nanoparticles 70 contained in the bonding member 40, any appropriate material can be used, and organic or inorganic materials can be used. The nanoparticles 70 are preferably a light-transmissive material in view of the light extraction efficiency of the light-emitting device 1. At least one of zirconium oxide, silicon oxide, aluminum oxide, titanium oxide, and cellulose can be used for the nanoparticles 70. Particles of inorganic materials have good heat and light resistances and relatively high heat conductivity.

Among these materials, zirconium oxide, silicon oxide, aluminum oxide, and titanium oxide are readily available and relatively inexpensive. In particular, zirconium oxide is preferable because it has high refractive index, heat resistance, and stable structure. Examples of the resin serving as the base material in which the nanoparticles 70 are contained include silicone resins, epoxy resins, phenolic resins, polycarbonate resins, acrylic resins, and modified resins of these resins. For the resin serving as the base material resin, silicone-modified epoxy resins and organic silicone resins are preferably used, and organic silicone resins are more preferably used. Specific examples of organic silicone resins include dimethyl silicones and phenyl silicones.

The nanoparticles 70 preferably have a spherical shape, while any shapes other than a spherical shape can be employed. When the nanoparticles 70 has a shape other than a spherical shape, an average particle diameter is preferably employed as the particle diameter.

Components in the base resin have respective solubility parameters (SP values). Large difference in SP value induces bad compatibility, which causes the components to flow out. This results in resin dripping, and the fillet is not formed properly. The resin dripping can cause degradation of the balance of the components in the base resin. For example, if the component that has flowed out is a component to contribute to the hardening of the base material resin when the base material resin is cured, shear strength, which is strength of bonding to the light-transmissive member 30, can be decreased. Addition of the nanoparticles 70 to the base material resin can reduce dripping of the resin. This allows the fillet to be formed properly, so that shear strength can be improved. Further, with the fillet formed properly, luminous flux can be increased to improve the light extraction efficiency.

The bonding member 40 preferably has a refractive index of 1.45 or more and 1.70 or less. The expression "the refractive index of the bonding member 40" as used herein refers to the refractive index of the entirety of the resin containing the nanoparticles with respect to light of the wavelength of a D-line emission of sodium lamp (589 nm). The bonding member 40 made of phenyl silicone resins containing nano-order zirconium oxide particles allows the refractive index of the bonding member 40 to be within the range described above. With the bonding member 40 having the refractive index described above, the total reflection on the boundary surface between the light-emitting element 10 and the bonding member 40 can be reduced. This allows for increasing the luminous flux of the light-emitting device 1 to improve the light-extraction performance.

In the bonding member 40, as shown in FIGS. 2 to 3B, the nanoparticles 70 are preferably disposed in a portion of a peripheral portion (also referred to herein as a second peripheral portion) 43 of the bonding member 40 at a convex-curved lower edge 41 side, at which the lower edge 41 that is convexly curved in a side view is located, (i.e., a portion of the peripheral portion at the light-emitting element 10 side), and/or in a portion of the peripheral portion 43 of the bonding member 40 at a concave-curved outer surface 42 side, at which the outer surface 42 that is concavely curved in a cross-sectional view is located. Also, in the bonding member 40, the nanoparticles 70 are preferably dispersed predominantly in at least a portion of the peripheral portion 43 of the bonding member 40. The expression "the at least a portion of the peripheral portion 43" as used herein refers to at least a portion of the bonding member 40 that covers at least one of the four third surfaces 14. The bonding member 40 preferably has, on all of the four third surfaces 14, a region in which the nanoparticles 70 are dispersed predominantly.

With the nanoparticles 70 disposed to be dispersed predominantly at the peripheral portion 43 of the bonding member 40, the nanoparticles 70 at the peripheral portion 43 can attract each other by capillary attraction force. This can reduce resin dripping of the bonding member 40, that is, wet-spreading of the bonding member 40 on the third surface 14 toward the electrodes 16 and 17, so that the fillet can be stably formed. Also, the nanoparticles 70 are preferably disposed to be dispersed predominantly at a peripheral portion (also referred to herein as a first peripheral portion) 44 of the bonding member 40 at the light-transmissive member 30 side.

Because capillary attraction force is easily generated in a colloidal solution having high dispersibility, surface treatment for the nanoparticles 70 (that is, forming an adhering material on the surface of the nanoparticles 70) can be performed to decrease agglomeration. Also, a dispersant can be mixed with the nanoparticles 70. Examples of the surface treatment agent for the nanoparticles 70 include long-chain aliphatic amines or derivatives thereof, long-chain aliphatic fatty acids or derivatives thereof, silane coupling agents, siloxane compounds containing amine groups and/or carboxyl groups, siloxane compounds containing at least one of silanol groups, hydrogensilane groups, and alcohol groups, siloxane compounds containing vinylsilyl groups and at least one of silanol groups, alkoxy groups, and hydrogensilane groups, monoglycidyl ether-capped siloxane compounds, monohydroxy ether-capped siloxane compounds, organic silazane compounds, organic titanate compounds, isocyanate compounds, epoxy compounds, phosphoric acid, or phosphoric ester compounds. Examples of the dispersant include, in addition to the above surface treatment agents, macromolecular compounds containing acid groups or basic groups, fluorine-containing surfactants, polyol compounds, polyethylene oxide derivatives, polypropylene oxide derivatives, polyvalent fatty acid derivatives, hydrolysates of silane coupling agents, and quaternary ammonium salt compounds.

On the third surface 14 of the light-emitting element 10, the number of the nanoparticles 70 at the third surface 14 side is preferably less than the number of the nanoparticles 70 at the peripheral portion 43 at a lower edge 41 side of the bonding member 40 that is curved convexly in a side view, as shown in FIGS. 2 to 3B. Also, in a region on the third surface 14 of the light-emitting element 10, the number of nanoparticles 70 at the third surface 14 side is preferably less than the number of nanoparticles 70 at a side of the outer surface 42, concavely curved in a cross-sectional view, of the bonding member 40. Thus, for example, the number of the nanoparticles 70 in the bonding member 40 at a region adjacent to an upper edge of the third surface 14 is less than a number of the nanoparticles 70 in the bonding member 40 at the first peripheral portion 44, as shown in FIG. 3B (see also, FIG. 7 discussed below), and the number of the nanoparticles 70 in the bonding member 40 at the region adjacent to the upper edge of the third surface 14 is less than the number of the nanoparticles 70 in the bonding member 40 at the second peripheral portion 43, as shown in FIG. 3B (see also, FIG. 7 discussed below). With this structure of the bonding member 40, light emitted from the light-emitting element 10 is not interrupted by the nanoparticles 70. This increases the luminous flux to improve the light-extraction performance.

Method of Manufacturing Light-Emitting Device

A method of manufacturing the light-emitting device according to the first embodiment will be described below.

Figure 5:
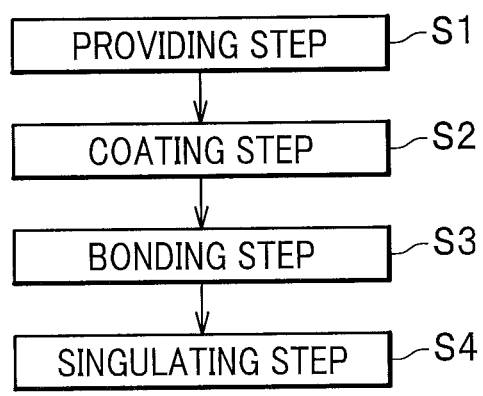
FIG. 5 is a flowchart illustrating a method of manufacturing the light-emitting device according to the first embodiment.
Figure 6A:
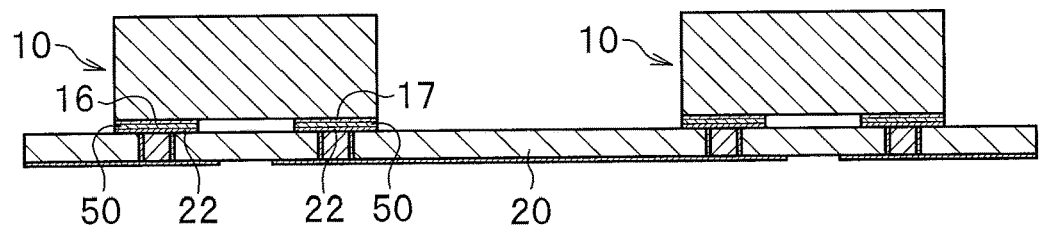
FIG. 6A is a schematic cross-sectional view illustrating a light-emitting element that is electrically connected to a supporting member in a providing step in the method of manufacturing the light-emitting device according to the first embodiment.
Figure 6B:
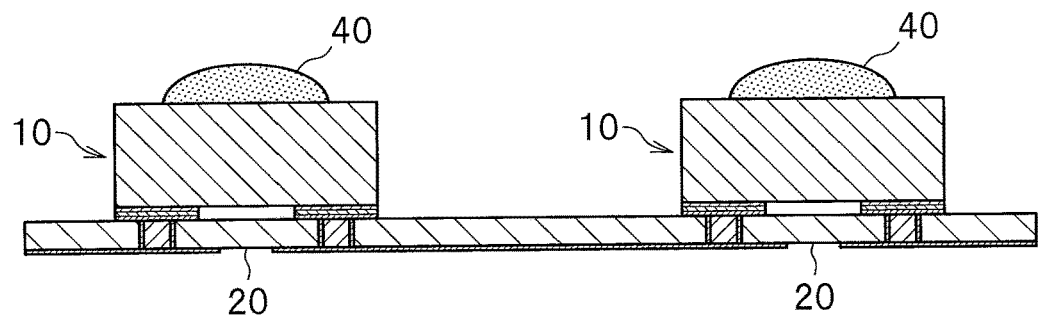
FIG. 6B is a schematic cross-sectional view illustrating the light-emitting element in which a first surface is coated with the bonding member in a coating step in the method of manufacturing the light-emitting device according to the first embodiment.
Figure 6C:
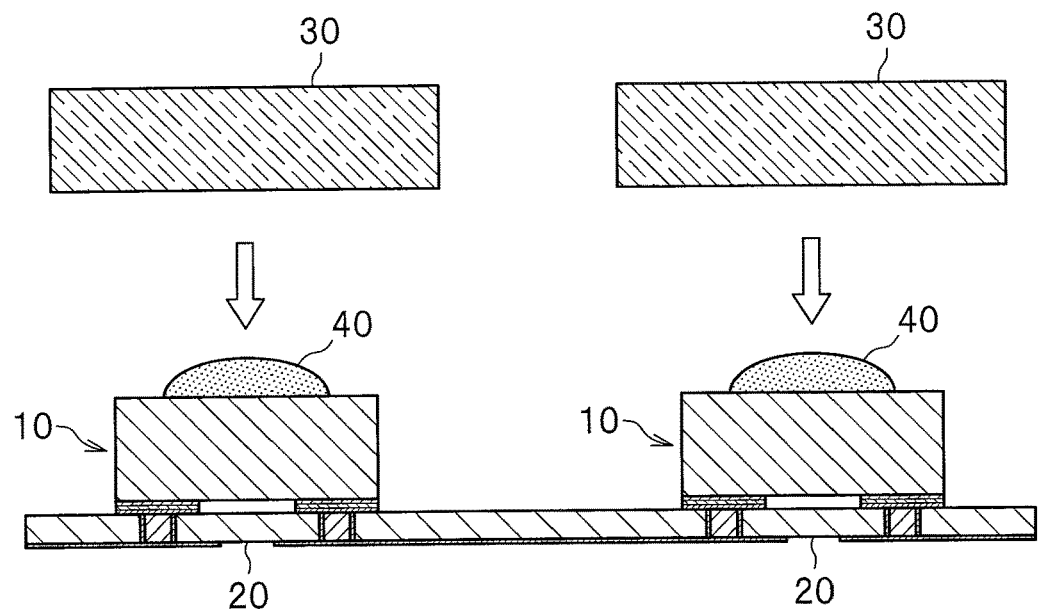
FIG. 6C is a schematic cross-sectional view illustrating a light-transmissive member to be disposed at the first surface and to be pressed onto the bonding member in a bonding step in the method of manufacturing the light-emitting device according to the first embodiment.
Figure 6D:
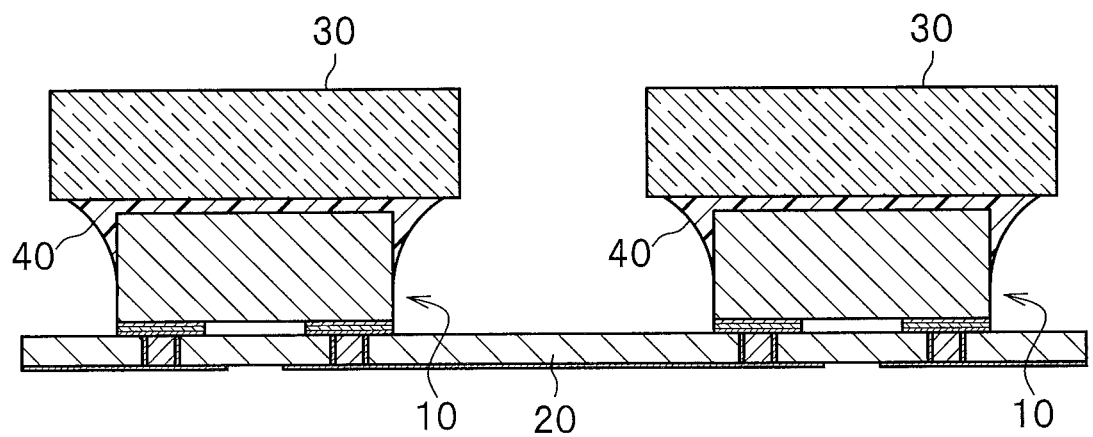
FIG. 6D is a schematic cross-sectional view illustrating the light-emitting element that has the first surface and a third surface covered by the bonding member and that is bonded to the light-transmissive member in the bonding step in the method of manufacturing the light-emitting device according to the first embodiment.
Figure 6E:
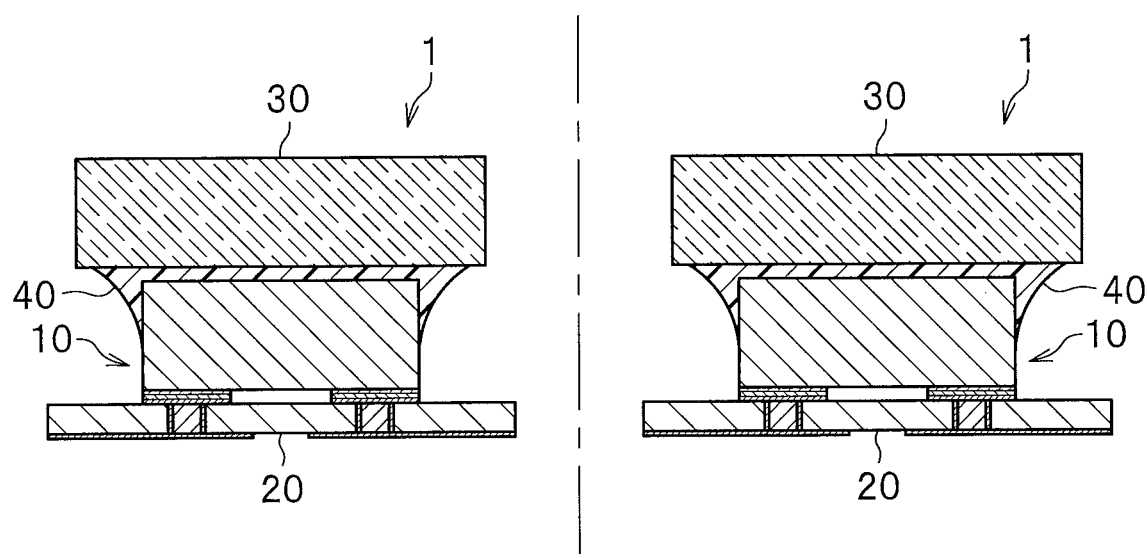
FIG. 6E is a schematic cross-sectional view illustrating the light-emitting device singulated in a singulating step in the method of manufacturing the light-emitting device according to the first embodiment.

FIG. 5 is a flowchart illustrating a method of manufacturing the light-emitting device according to the first embodiment. FIG. 6A is a schematic cross-sectional view illustrating a light-emitting element that is electrically connected to a supporting member in a providing step in the method of manufacturing the light-emitting device according to the first embodiment. FIG. 6B is a schematic cross-sectional view illustrating the light-emitting element in which a first surface is coated with the bonding member in a coating step in the method of manufacturing the light-emitting device according to the first embodiment. FIG. 6C is a schematic cross-sectional view illustrating a light-transmissive member to be disposed at the first surface and to be pressed onto the bonding member in a bonding step in the method of manufacturing the light-emitting device according to the first embodiment. FIG. 6D is a schematic cross-sectional view illustrating the light-emitting element that has the first surface and the third surface covered by the bonding member and that is bonded to the light-transmissive member in the bonding step in the method of manufacturing the light-emitting device according to the first embodiment. FIG. 6E is a schematic cross-sectional view illustrating the light-emitting device singulated in a singulating step in the method of manufacturing the light-emitting device according to the first embodiment.

As shown in FIG. 5, the method of manufacturing a light-emitting device according to first embodiment includes a providing step S1, a coating step S2, a bonding step S3, and a singulating step S4. The structure of the light-emitting device is described referring to FIGS. 1 to 3B. Each of these steps will be described below.

Providing Step

In the providing step S1, as shown in FIG. 6A, each of a plurality of light-emitting elements 10 is electrically connected to a supporting member 20. Each of the light-emitting elements 10 has a first surface 12 serving as a light extraction surface, a second surface 13 opposite to the first surface 12, a plurality of third surfaces 14 between the first surface 12 and the second surface 13, and a pair of electrodes 16 and 17 at a second surface 13 side. The supporting member 20 includes wirings 22 on a surface of and inside of a base member 21. A known connecting method is used to connect the light-emitting element 10 and the supporting member 20. For example, the wiring 22 and the electrodes 16 and 17 are electrically connected via an electroconductive bonding member 50 such as solders. The light-emitting element 10 can have a corner portion 15 defined by adjacent ones of the plurality of third surfaces 14.

Coating Step

In the coating step S2, as shown in FIG. 6B, the bonding member 40 is applied on the first surface 12 of the light-emitting element connected to the supporting member 20. The bonding member 40 is made of a resin that contains nanoparticles. The nanoparticles have a particle diameter of 1 nm or more and 30 nm or less and a content of 10 mass % or more and 20 mass % or less. Also, application of the bonding member 40 on first surface 12 can be performed using a known method, for example, pin transfer and potting.

Bonding Step

In the bonding step S3, as shown in FIGS. 6C and 6D, the light-transmissive member 30 is pressed onto the bonding member 40 to cover across the first surface 12 and the third surfaces 14 with the bonding member 40, then the bonding member 40 is cured to bond the light-emitting element 10 and the light-transmissive member 30. Each of a plurality of light-transmissive members 30 can be pressed onto a respective one of light-emitting elements 10, or a single light-transmissive member 30 can be pressed onto a plurality of light-emitting elements 10.

In the bonding step S3, the light-transmissive member 30 is pressed onto the bonding member 40 applied on the first surface 12, and then cured at 150° C. This allows the bonding member 40 to form a fillet that has a predetermined shape between the light-emitting element 10 and the light-transmissive member 30. The predetermined shape of the fillet can be obtained by controlling the particle diameter and the content of the nanoparticles 70 contained in the bonding member 40 within the range described above. Also, in order to prevent the bonding member 40 from reaching the second surface 13, the content of a resin to form the fillet is to be adjusted by, for example when using pin transfer, adjusting the opening of a squeegee. The bonding member 40 is cured using a known technique such as heat drying or natural drying.

The fillet preferably has such a shape that the lower edge 41 of the bonding member 40 covering the third surfaces 14 is located above the second surface 13 and is curved convexly from the corner portion 15 toward the center of the third surface 14 in a side view. Also, the fillet has such a shape that the outer surface 42 of the bonding member 40 covering the third surfaces 14 is preferably is curved concavely from the light-transmissive member 30 toward the third surface 14 side in a cross-sectional view. Further, the nanoparticles 70 are preferably dispersed predominantly at a peripheral portion 43 of the bonding member 40 having the fillet.

Singulating Step

In the singulating step S4, as shown in FIG. 6E, the supporting member 20 between the light-emitting elements 10 is cut by laser irradiation or using a tool such as a blade to obtain the light-emitting devices 1. In the case of pressing a single light-transmissive member 30 onto a plurality of light-emitting elements in the bonding step, the light-transmissive member 30 and the supporting member 20 are cut to obtain the light-emitting devices in the singulating step.

Second Embodiment

Light-Emitting Device

A light-emitting device according to a second embodiment will be described below.

Figure 7:
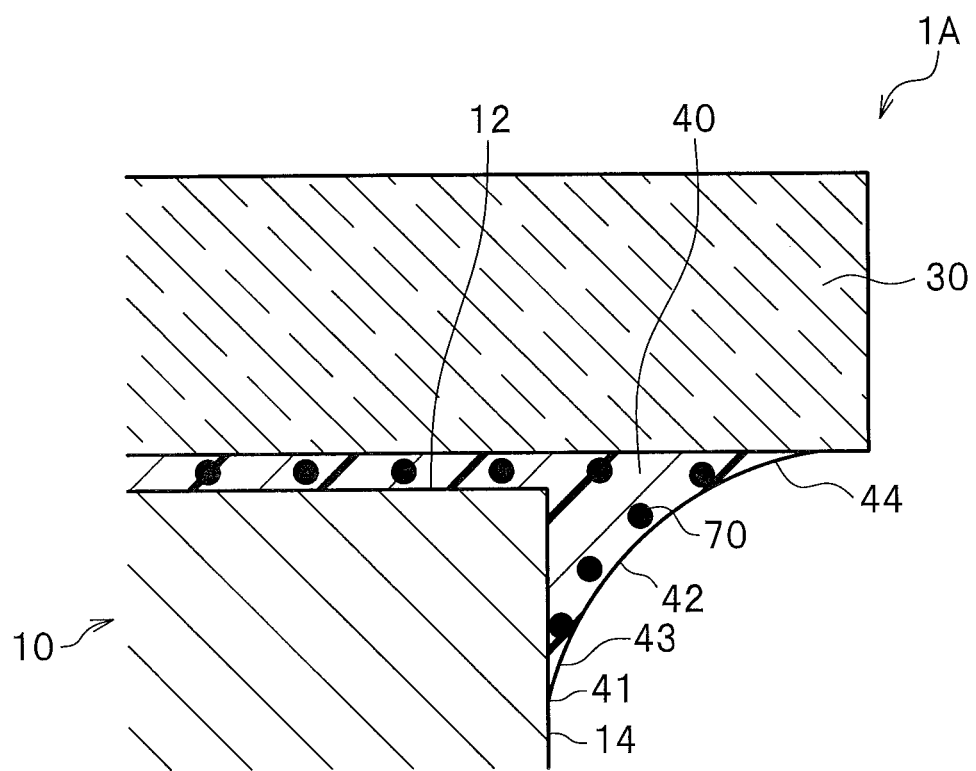
FIG. 7 is a schematic partial enlarged cross-sectional view illustrating the structure of a light-emitting device according to a second embodiment and a distribution of nanoparticles in a bonding member.

FIG. 7 is a schematic partial enlarged cross-sectional view illustrating the structure of a light-emitting device according to a second embodiment and a distribution of nanoparticles in a bonding member.

A light-emitting device 1A according to the second embodiment has the same structure as that of the light-emitting device 1 according to the first embodiment except that the nanoparticles 70 contained in the bonding member 40 have a particle diameter of greater than 30 nm and less than 100 nm and a content of 0.5 mass % or more and 10 mass % or less.

In the light-emitting device 1A, in the case in which the light-emitting element 10 has the corner portion 15 defined by adjacent ones of the plurality of third surfaces 14, the bonding member 40 bonding the light-emitting element 10 and the light-transmissive member 30 forms a fillet in a shape that is curved convexly in a side view and curved concavely in a cross-sectional view by controlling the particle diameter and the content of the nanoparticles 70 within the range described above. More specifically, in a side view, a lower edge of the bonding member 40 covering the third surfaces 14 is located above the second surface 13 and is curved convexly from the corner portion 15 toward the center of the third surface 14. The nanoparticles 70 are disposed at a convex-curved peripheral portion of the bonding member 40. In a cross-sectional view, the outer surface of bonding member 40 that covers the third surface 14 is curved concavely from the light-transmissive member 30 toward the third surface 14. In the case in which the nanoparticles 70 have a larger particle diameter, with a great content of nanoparticles 70 contained in the bonding member 40, the nanoparticles 70 tend to disperse uniformly in the bonding member 40 as shown in FIG. 7. Also, in the light-emitting device 1A, the nanoparticles 70 are disposed at a peripheral portion 43 of the bonding member 40, which allows for preventing resin dripping of the bonding member 40. In the case in which the bonding member 40 contains a high concentration of the nanoparticles 70, concentration gradient of the nanoparticles 70 is not large due to the large total content of the nanoparticles 70 with respect to the bonding member 40.

Method of Manufacturing Light-Emitting Device

A method of manufacturing the light-emitting device according to the second embodiment will be described below.

The method of manufacturing the light-emitting device 1A according to the second embodiment is the same as the method of manufacturing the light-emitting device 1 according to the first embodiment except for the range of the particle diameter and the content of the nanoparticles 70.

Third Embodiment

A light-emitting device according to a third embodiment will be described below.

Figure 8:
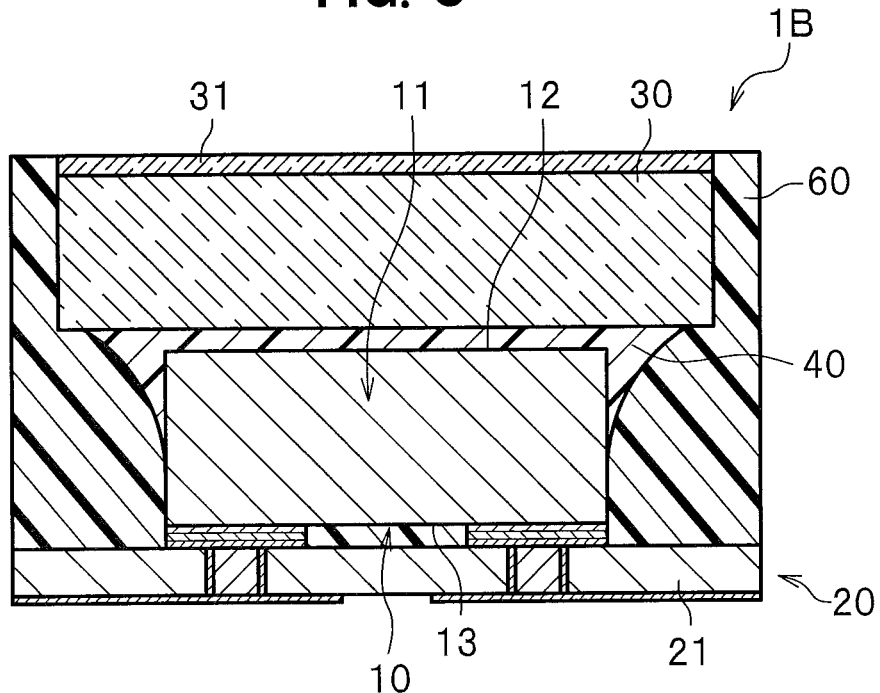
FIG. 8 is a schematic cross-sectional view in a longitudinal direction illustrating the structure of a light-emitting device according to a third embodiment.

FIG. 8 is a schematic cross-sectional view in a longitudinal direction illustrating the structure of the light-emitting device according to the third embodiment.

As shown in FIG. 8, the light-emitting device 1B according to the third embodiment has the same structure as that of the light-emitting devices according to the first and second embodiments except that the light-transmissive member 30 has a light-transmissive layer 31 and a covering member 60 on an upper surface of the light-transmissive member 30.

Light-Transmissive Layer

The light-emitting device 1B includes the light-transmissive layer 31, which contains substantially no wavelength conversion substance, on the light-transmissive member 30. With this structure, the light-transmissive layer 31 serves as a protective layer of the light-transmissive member 30. This allows for reducing deterioration of the wavelength conversion substance. The light-transmissive layer 31 is made of, for example, a silicone resin.

Covering Member

The covering member 60 covers the light-emitting element 10 and the bonding member 40 and is preferably a light-reflective member that contains reflective materials. In view of upward light extraction efficiency, the covering member 60 preferably has the light reflectance of 70% or more, more preferably 80% or more, even more preferably 90% or more at the peak emission wavelength of the light-emitting element 10. Further, the covering member 60 is preferably white. Accordingly, the covering member 60 preferably contains a white pigment as the reflective material dispersed in the base material resin.

Examples of the base material resin for the covering member 60 include silicone resins, epoxy resins, phenolic resins, polycarbonate resins, acrylic resins, or modified resins of these resins. Among these resins, silicone resins and modified silicone resins, which have good heat and light resistance, are preferable. More specific examples of the silicone resins include dimethyl silicone resins, phenylmethyl silicone resins, and diphenyl silicone resins.

White Pigment

For the white pigment, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide can be used singly, or two or more of these can be used in combination. A shape of the white pigment can be appropriately selected. The white pigment can have irregular or crushed shape, but preferably has a spherical shape in view of fluidity. Also, the particle diameter of the white pigment is, for example, approximately 0.1 μm or more and 0.5 μm or less. The smaller the particle diameter is, the more preferable, to enhance effects of light reflection and covering. The content of the white pigment in the light-reflective covering member can be appropriately selected. In view of light reflectivity, the viscosity in a fluid state, and the like, the content of the white pigment is, for example, preferably 10 mass % or more and 80 mass % or less, more preferably 20 mass % or more and 70 mass % or less, even more preferably 30 mass % or more and 60 mass % or less.

Method of Manufacturing Light-Emitting Device

A method of manufacturing the light-emitting device according to the third embodiment will be described below.

Figure 9:
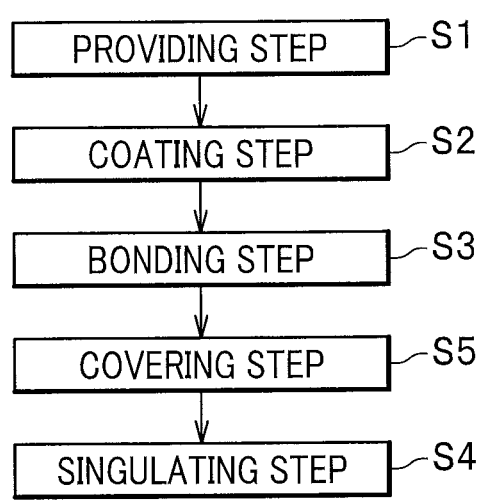
FIG. 9 is a flowchart illustrating a method of manufacturing the light-emitting device according to the third embodiment.
Figure 10A:
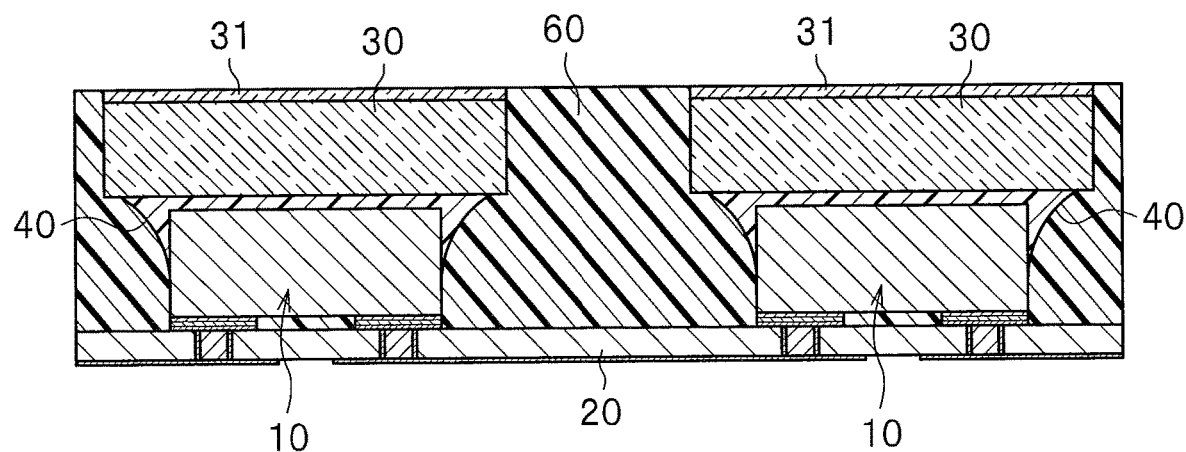
FIG. 10A is a schematic cross-sectional view illustrating a light-emitting element to which a light-transmissive member covered with a covering member is bonded in a covering step in the method of manufacturing the light-emitting device according to the third embodiment.
Figure 10B:
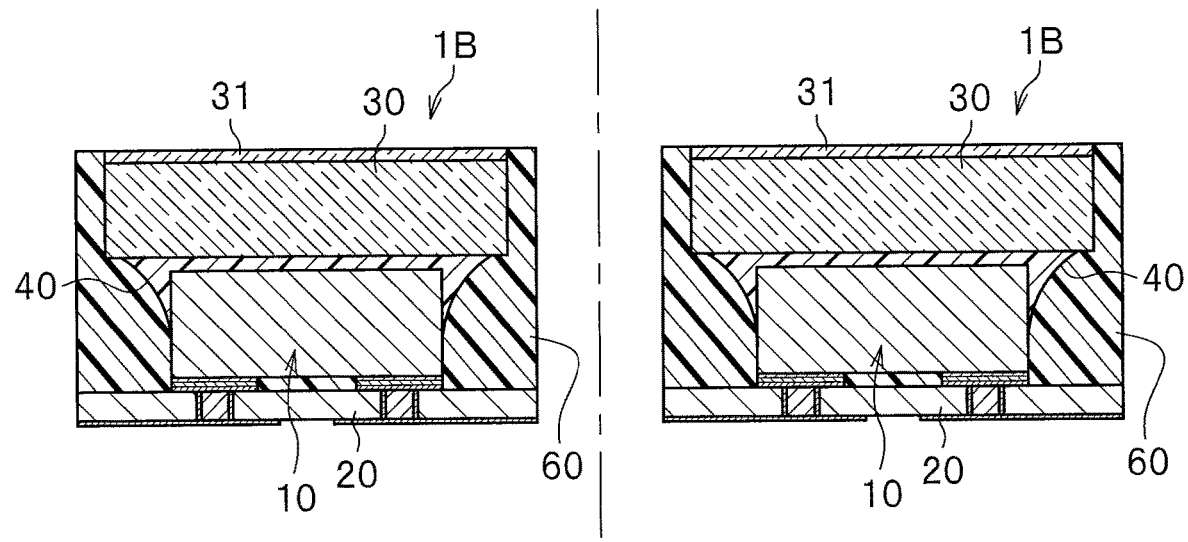
FIG. 10B is a schematic cross-sectional view illustrating the light-emitting device that is singulated in a singulating step in the method of manufacturing the light-emitting device according to the third embodiment.

FIG. 9 is a flowchart illustrating a method of manufacturing the light-emitting device according to the third embodiment. FIG. 10A is a schematic cross-sectional view illustrating a light-emitting element to which a light-transmissive member covered with a covering member is bonded in a covering step in the method of manufacturing the light-emitting device according to the third embodiment. FIG. 10B is a schematic cross-sectional view illustrating the light-emitting device that is singulated in a singulating step in the method of manufacturing the light-emitting device according to the third embodiment.

As shown in FIG. 9, the method of manufacturing the light-emitting device according to the third embodiment is the same as the method of manufacturing the light-emitting device according to the first embodiment except for the covering step S5 and the singulating step S4.

Covering Step

After the bonding step S3, the covering step S5 is performed. In the covering step, the covering member 60 is formed to cover the light-emitting element 10 and the bonding member 40 as shown in FIG. 10A. In the covering step S5, a liquid covering member 60 is supplied by transfer molding, injection molding, compression molding, potting, or the like to cover the light-emitting element 10 and the bonding member 40, and cured by heat-drying, natural drying, and the like.

Singulating Step

In the singulating step S4, the supporting member 20 and the covering member 60 between the light-emitting elements 10 are cut by laser irradiation or using a tool such as a blade to obtain the light-emitting devices 1B as shown in FIG. 10B. At this time, a cutting portion can be appropriately adjusted such that one light-emitting device 1B includes two or more light-emitting elements 10. The supporting member 20 can be removed using a method such as grinding, between the covering step S5 and the singulating step S4. In the case of pressing a single light-transmissive member 30 onto a plurality of light-emitting elements in the bonding step, the light-transmissive member, the covering member, and the supporting member 20 are cut to obtain the light-emitting devices in the singulating step S4.

EXAMPLES

The light-emitting device according to Examples 1 to 6 according to certain embodiments of the present disclosure and the light-emitting device according to Comparative Examples were experimentally produced, and their respective effect were confirmed.

Example 1 and Example 2

A plurality of light-emitting elements were soldered to the supporting member in a face-down manner. Bonding members were applied to respective light extraction surfaces of respective soldered light-emitting elements. Then, a plurality light-transmissive member each including a light-transmissive layers on an upper surface of the light-transmissive member was disposed on the bonding member. The light-transmissive members each including a respective light-transmissive layer on the upper surface of each light-transmissive member was pressed onto the light-emitting element to mount, and the bonding member was cured by heat to bond the light-emitting element and the light-transmissive member. The covering member was supplied between the light-emitting elements and cured by heat. The light-emitting devices according to Example 1 and Example 2 were obtained by dicing the covering member and the supporting member between the light-emitting elements such that a single light-emitting device included two light-emitting elements. Details of components of the light-emitting device are described below.

Supporting Member

The supporting member having wirings on the surface and inside of the base material made of BT resins was used.

Light-Emitting Element

A blue LED containing a nitride semiconductor having a peak emission wavelength of 448 to 450 nm was used for the light emitting element.

Light-Transmissive Member

A phenyl silicone resin containing KSF phosphors and β-SiAlON was used for wavelength conversion substances.

Light-Transmissive Layer

A silicone resin was used for the light-transmissive layer.

Bonding Member

A phenyl silicone resin containing zirconium oxide particles (nanoparticles) with a particle diameter of 5 nm at a content shown in Table 1 was used for the bonding member. The bonding member had a refractive index shown in Table 1. The refractive index shown in Table 1 is a refractive index with reference to the wavelength of the D-line emission of sodium lamp (589 nm).

Covering Member

Phenyl silicone resin with titanium oxide as the reflective material was used for the covering member.

Reference Example 1, Comparative Example 1, and Comparative Example 2

In order to compare with the light-emitting devices according to Example 1 and Example 2, a light-emitting device according to Reference Example 1 and light-emitting devices according to Comparative Example 1 and Comparative Example 2 were produced in a same manner as the light-emitting devices according to Example 1 and Example 2. In Reference Example 1, a light-emitting device in which the bonding member was made of a phenyl silicone resin containing no nanoparticles was produced. In Comparative Example 1, a light-emitting device in which the bonding member was made of a phenyl silicone resin containing a small content of nanoparticles was produced. In Comparative Example 2, a light-emitting device in which the bonding member was made of a phenyl silicone resin containing a large content of nanoparticles was produced. Details of the components of each of these light-emitting device were the same as those in Examples 1 and 2. The refractive index shown in Table 1 is a refractive index with reference to the wavelength of the D-line emission of sodium lamp (589 nm).

Evaluation of Characteristics

Formation of fillets, ratios of luminous fluxes, and shear strengths of the produced light-emitting devices were measured and evaluated in the procedure below.

Formation of Fillets

The fillets of the bonding member in the produced light-emitting devices were observed. Then, a fillet in which dripping of the resin was observed was classified as "bad", a fillet in which a slight dripping of the resin occurred was classified as "not good enough" and a fillet in which dripping of the resin was not observed was classified as "good". The results are shown in Table 1.

Ratios of Luminous Fluxes

The luminous fluxes of the produced light-emitting devices were measured using an integrating sphere. The results are shown as the ratios of luminous fluxes in Table 1. The ratios of luminous fluxes in Example 1, Example 2, Comparative Example 1, and Comparative Example 2 were calculated by comparing respective luminous flux values in Example 1, Example 2, Comparative Example 1, and Comparative Example 2 with the luminous flux value of Reference Example 1 set as 100. The ratios of luminous fluxes were classified as "bad" in the case of 100% or less, "not good enough" in the case in which the ratio was greater than 100% but the improvement ratio to the value of Reference Example 1, in which no nanoparticle was contained, was less than 0.5%, and "good" in the case in which the ratio was greater than 100% and the improvement ratio to the value of Reference Example 1 was 0.5% or more.

Shear Strength

The shear strength is a measured load that causes detachment of the bonding member between the light-emitting element and the light-transmissive member when the light-emitting element is pressed horizontally in a short direction at room temperature. The measurement has been performed by using a known shear strength test equipment (for example, 4000 Series Bondtester manufactured by Dage). The measurement was performed according to the MIL standard (MIL-STD-883G). The shear strength of 180 gf or more was determined to be allowable in practical use. The results of the shear strength measurement are shown in Table 1.

TABLE 1

| | Bonding member | | | | Evaluation results | | |
|---|---|---|---|---|---|---|---|
| | Base resin type | Particle diameter of nanoparticle (nm) | Content of nanoparticle (mass %) | Refractive index | Formation of fillet | Ratio of luminous flux (%) | Shear strength (gf) |
| Reference example 1 | Phenyl silicone resin | — | — | 1.56 | Not good enough | Ref. (100.0) | 155 |
| Comparative example 1 | Phenyl silicone resin | 5 | 1.0 | 1.56 | Not good enough | Not good enough (100.3) | 161 |
| Example 1 | Phenyl silicone resin | 5 | 10 | 1.56 | Good | Good (101.0) | 188 |
| Example 2 | Phenyl silicone resin | 5 | 20 | 1.56 | Good | Good (100.7) | 185 |
| Comparative example 2 | Phenyl silicone resin | 5 | 25 | 1.56 | Good | Not good enough (100.4) | 175 |

As shown in Table 1, in Example 1 and Example 2, the particle diameter and the content of nanoparticles contained in the bonding member were within respective predetermined ranges and thus the formation of the fillets, the ratios of the luminous fluxes, and the shear strengths were good.

In contrast, in Comparative Example 1, the content of nanoparticles contained in the bonding member was small, and the formation of the fillet, the ratio of the luminous flux, and the shear strength were poor. In Comparative Example 2, the content of nanoparticles contained in the bonding member was large, and thus the ratio of the luminous flux and the shear strength were poor.

Example 3 to Example 6

In each of Example 3 to Example 6, the light-emitting device was produced in the same procedure as in Example 1 and Example 2, except that a phenyl silicone resin in which zirconium oxide particles (nanoparticles) with a particle diameter of 40 nm were contained at a content shown in Table 2 was used for the bonding member.

Reference Example 2, Comparative Example 3, and Comparative Example 4

In order to compare light-emitting devices according to Example 3 to Example 6, a light-emitting device according to Reference Example 2 and light-emitting devices according to Comparative Example 3 and Comparative Example 4 were produced in a same manner as the light-emitting devices according to Example 3 to Example 6. In Reference Example 2, a light-emitting device in which a phenyl silicone resin containing no nanoparticles was used for the bonding member was produced. In Comparative Example 3 and Comparative Example 4, a light-emitting device in which a phenyl silicone resin containing a large content of nanoparticles was used for the bonding member was produced. The refractive index shown in Table 2 is the refractive index with respect to the wavelength of the D-line emission of sodium lamp (589 nm).

Evaluation of Characteristics

Formation of fillets, ratios of luminous fluxes, and shear strengths of the produced light-emitting devices were measured and evaluated in the same manner as above. The results are shown in Table 2.

For evaluating the ratio of the luminous flux, the ratios of luminous fluxes were calculated by comparing the luminous flux of each of Example 3 to Example 6 and Comparative Example 3 and Comparative Example 4 with the luminous flux value of Reference Example 2 that is set as 100. The ratios of luminous fluxes were classified as "bad" in the case of 100% or less, "not good enough" in the case in which the ratio was greater than 100% but the improvement ratio to the value of Reference Example 2, in which no nanoparticle was contained, was less than 0.5%, and "good" in the case in which the ratio was greater than 100% and the improvement ratio to the value of Reference Example 2 was 0.5% or more.

TABLE 2

| | Bonding member | | | | Evaluation results | | |
|---|---|---|---|---|---|---|---|
| | Base resin type | Particle diameter of nanoparticle (nm) | Content of nanoparticle (mass %) | Refractive index | Formation of fillet | Ratio of luminous flux (%) | Shear strength (gf) |
| Reference example 2 | Phenyl silicone resin | — | — | 1.56 | Not good enough | Ref. (100.0) | 157 |
| Example 3 | Phenyl silicone resin | 40 | 0.5 | 1.56 | Good | Good (100.9) | 211 |

TABLE 2-continued

| | Bonding member | | | | | Evaluation results | |
|---|---|---|---|---|---|---|---|
| | Particle | | | | | | |
| | Base resin type | diameter of nanoparticle (nm) | Content of nanoparticle (mass %) | Refractive index | Formation of fillet | Ratio of luminous flux (%) | Shear strength (gf) |
| Example 4 | Phenyl silicone resin | 40 | 1.0 | 1.56 | Good | Good (101.2) | 219 |
| Example 5 | Phenyl silicone resin | 40 | 5.0 | 1.56 | Good | Good (100.8) | 227 |
| Example 6 | Phenyl silicone resin | 40 | 10 | 1.56 | Good | Good (100.9) | 230 |
| Comparative example 3 | Phenyl silicone resin | 40 | 15 | 1.56 | Good | Bad (99.7) | 227 |
| Comparative example 4 | Phenyl silicone resin | 40 | 20 | 1.56 | Good | Bad (96.5) | 216 |

As shown in Table 2, in each of Example 3 to Example 6, the particle diameter and the content of nanoparticles contained in the bonding member were within respective predetermined range, and the formation of the fillets, the ratios of the luminous fluxes, and the shear strengths were good.

In contrast, in each of Comparative Example 3 and Comparative Example 4, the content of nanoparticles contained in the bonding member was large and thus the ratio of the luminous flux was poor. In Comparative Example 3 and Comparative Example 4, the total content of nanoparticles in the bonding member was large, and agglomeration occurred. As a result, in Comparative Example 3 and Comparative Example 4, the aggregates caused unnecessary light scattering, resulting in decrease of the luminous flux.

Further, it was found from Examples described above that the range of the content of the nanoparticles contained in the bonding member, the nanoparticles acting effectively, was related to the particle diameter of the nanoparticles. That is, the content of the nanoparticles can be adjusted such that the content is increased when the nanoparticles have a small particle diameter and decreased when the nanoparticles have a large particle diameter.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light-emitting device comprising:
a light-emitting element including:
a first surface provided as a light extraction surface;
a second surface opposite to the first surface;
a plurality of third surfaces between the first surface and the second surface; and
a positive electrode and a negative electrode provided at the second surface;
a light-transmissive member disposed at the first surface; and
a bonding member disposed between the light-emitting element and the light-transmissive member and covering from the first surface to the plurality of third surfaces of the light-emitting element to bond the light-emitting element and the light-transmissive member,
wherein the bonding member is made of a resin that contains nanoparticles,
wherein the nanoparticles have a particle diameter of 1 nm or more and 30 nm or less and a content of 10 mass % or more and 20 mass % or less,
wherein, in a cross-sectional view, an outer surface of the bonding member covering a third surface of the plurality of third surfaces is curved concavely from the light-transmissive member toward the third surface,
wherein the nanoparticles are disposed at a first peripheral portion of the bonding member, the first peripheral portion being adjacent to both the outer surface and the light-transmissive member, and
wherein a number of the nanoparticles in the bonding member at a region adjacent to an upper edge of the third surface is less than a number of the nanoparticles in the bonding member at the first peripheral portion.

2. The light-emitting device according to claim 1,
wherein each of the plurality of third surfaces has a corner portion defined by adjacent ones of the plurality of third surfaces, and
wherein a lower edge of the bonding member covering the third surface is located above the second surface and is curved convexly from the cornier portion to the center of the third surface in a side view.

3. The light-emitting device according to claim 2, wherein the nanoparticles are further located at a second peripheral portion located at a side of the convexly curved lower edge of the bonding member.

4. A light-emitting device comprising:
a light-emitting element including:
a first surface provided as a light extraction surface;
a second surface opposite to the first surface;
a plurality of third surfaces between the first surface and the second surface; and
a positive electrode and a negative electrode provided at the second surface;
a light-transmissive member disposed on the first surface; and
a bonding member disposed between the light-emitting element and the light-transmissive member and covering from the first surface to the plurality of third surfaces of the light-emitting element to bond the light-emitting element and the light-transmissive member, wherein the bonding member is made of a resin that contains nanoparticles, wherein the nanoparticles have a particle diameter of more than 30 nm and less than 100 nm and a content of 0.5 mass % or more and 10 mass % or less, wherein, in a cross-sectional view an outer surface of the bonding member covering a third surface of the plurality of third surfaces is curved concavely from the light-transmissive member toward the third surface, wherein the nanoparticles are disposed at a first peripheral portion of the bonding member, the first peripheral portion being adjacent to both the outer surface and the light-transmissive member, and wherein a number of the nanoparticles in the bonding member at a region adjacent to an upper edge of the third surface is less than a number of the nanoparticles in the bonding member at the first peripheral portion.

5. The light-emitting device according to claim 4, wherein each of the plurality of third surfaces has a corner portion defined by adjacent ones of the plurality of third surfaces, and wherein a lower edge of the bonding member covering the third surface is located above the second surface and is curved convexly from the corner portion toward the center of the third surface in a side view.

6. The light-emitting device according to claim 5, wherein the nanoparticles are further disposed at a second peripheral portion of the bonding member located at the lower edge of the bonding member, the second peripheral portion curving in a convex shape.

7. The light-emitting device according to claim 1, wherein an area in which the bonding member and the light-transmissive member are in contact with each other is larger than an area of the first surface of the light-emitting element.

8. The light-emitting device according to claim 4, wherein an area in which the bonding member and the light-transmissive member are in contact with each other is larger than an area of the first surface of the light-emitting element.

9. The light-emitting device according to claim 1, wherein at least one of zirconium oxide, silicon oxide, aluminum oxide, and titanium oxide is used for the nanoparticles.

10. The light-emitting device according to claim 4, wherein at least one of zirconium oxide, silicon oxide, aluminum oxide, and titanium oxide is used for the nanoparticles.

11. The light-emitting device according to claim 1, wherein a base material of the bonding member is made of an organic silicone resin.

12. The light-emitting device according to claim 4, wherein a base material of the bonding member is made of an organic silicone resin.

13. The light-emitting device according to claim 1, wherein the light-transmissive member contains a wavelength conversion substance.

14. The light-emitting device according to claim 4, wherein the light-transmissive member contains a wavelength conversion substance.

15. The light-emitting device according to claim 1, further comprising a covering member that covers the light-emitting element and the bonding member.

16. The light-emitting device according to claim 4, further comprising a covering member that covers the light-emitting element and the bonding member.

17. The light-emitting device according to claim 15, wherein the covering member contains a reflective material.

18. The light-emitting device according to claim 16, wherein the covering member contains a reflective material.

19. The light-emitting device according to claim 1, wherein the nanoparticles are further disposed at a second peripheral portion of the bonding member, the second peripheral portion being adjacent to both the outer surface and third surface of the light-emitting element, and wherein the number of the nanoparticles in the bonding member at the region adjacent to the upper edge of the third surface is less than a number of the nanoparticles in the bonding member at the second peripheral portion.

20. The light-emitting device according to claim 4, wherein the nanoparticles are further disposed at a second peripheral portion of the bonding member, the second peripheral portion being adjacent to both the outer surface and third surface of the light-emitting element, and wherein the number of the nanoparticles in the bonding member at the region adjacent to the upper edge of the third surface is less than a number of the nanoparticles in the bonding member at the second peripheral portion.

* * * * *